United States Patent
Zeng et al.

(10) Patent No.: US 11,990,572 B2
(45) Date of Patent: May 21, 2024

(54) LIGHT-EMITTING DIODE

(71) Applicant: Luminus(Xiamen) Co., Ltd., Fujian (CN)

(72) Inventors: Xiaoqiang Zeng, Fujian (CN); Fuxing Shi, Fujian (CN); Shao-Hua Huang, Fujian (CN); Lixun Yang, Fujian (CN)

(73) Assignee: LUMINUS(XIAMEN) CO., LTD., Fujian (CN)

( * ) Notice: Subject to any disclaimer, the term of this patent is extended or adjusted under 35 U.S.C. 154(b) by 17 days.

(21) Appl. No.: 17/017,255

(22) Filed: Sep. 10, 2020

(65) Prior Publication Data

US 2021/0091276 A1    Mar. 25, 2021

(30) Foreign Application Priority Data

Sep. 19, 2019   (CN) .......................... 201921563763.1

(51) Int. Cl.
*H01L 33/46* (2010.01)
*H01L 33/50* (2010.01)
*H01L 33/58* (2010.01)
*H01L 33/22* (2010.01)
*H01L 33/38* (2010.01)

(52) U.S. Cl.
CPC .............. *H01L 33/58* (2013.01); *H01L 33/46* (2013.01); *H01L 33/507* (2013.01); *H01L 33/22* (2013.01); *H01L 33/382* (2013.01); *H01L 2933/0091* (2013.01)

(58) Field of Classification Search
CPC ... H01L 33/54; H01L 2933/005; H01L 33/52; H01L 33/53; H01L 33/55; H01L 33/56
See application file for complete search history.

(56) References Cited

U.S. PATENT DOCUMENTS

| | | | | |
|---|---|---|---|---|
| 6,504,180 | B1* | 1/2003 | Heremans | H01L 33/025 257/E33.068 |
| 6,653,765 | B1* | 11/2003 | Levinson | F21K 9/62 313/112 |
| 7,573,071 | B2* | 8/2009 | Chang | H01L 33/52 257/787 |
| 2010/0084678 | A1* | 4/2010 | Streubel | H01L 33/50 257/E33.068 |
| 2011/0090696 | A1* | 4/2011 | Nagai | H01L 33/505 362/293 |
| 2012/0300431 | A1* | 11/2012 | You | G02B 19/0066 257/E33.059 |
| 2015/0091035 | A1* | 4/2015 | Kim | H01L 33/54 257/98 |
| 2019/0097094 | A1* | 3/2019 | Han | H01L 33/502 |

* cited by examiner

*Primary Examiner* — Matthew C Landau
*Assistant Examiner* — Dmitriy Yemelyanov
(74) *Attorney, Agent, or Firm* — Muncy, Geissler, Olds & Lowe, P.C.

(57) ABSTRACT

A light-emitting diode includes an epitaxial layered structure, a reflective layered unit, and a light-transmissive structure. The epitaxial layered structure has opposite upper and lower surfaces and a side surface interconnecting the upper and lower surfaces. The reflective layered unit is disposed on the lower surface of the epitaxial layered structure. The light-transmissive structure covers the upper surface of the epitaxial layered structure and a portion of the side surface of the epitaxial layered structure, and is configured to allow light emitted from the epitaxial layered structure to exit therefrom at a light-exit angle of not smaller than 125°.

13 Claims, 10 Drawing Sheets

LIGHT-EMITTING DIODE

CROSS-REFERENCE TO RELATED APPLICATION

This application claims priority of Chinese Utility Model Patent Application No. 201921563763.1, filed on Sep. 19, 2019.

FIELD

This disclosure relates to a semiconductor device, and more particularly to a light-emitting diode.

BACKGROUND

In recent years, lighting devices which are operable under a relatively high current density (e.g., not less than 2.5 A/mm$^2$) have received increased interest so as to meet various market demands. When operated under a relatively high current density, a horizontal light-emitting diode (LED) having a sapphire substrate is prone to damage caused by heat accumulation due to an unsatisfactory heat-dissipation property and a current-crowding effect of the sapphire substrate. In comparison, a substrate of a vertical LED might be made of a material having satisfactory heat-dissipation property and thermal conductivity to reduce the abovementioned current-crowding effect, and therefore the vertical LED is widely used as a light source that can be operated under a relatively high current density.

A conventional vertical LED might provide a relatively high lumen density of white light when operated under a relatively high current density, and thus is widely used for applications such as flash lights and projection lamps. Referring to FIG. 1, a conventional vertical LED generally includes an electrically conductive substrate 110, a reflective layered unit 13 formed on the electrically conductive substrate 110, an epitaxial layered unit 12 formed on the reflective layered unit 13 opposite to the electrically conductive substrate 110, a light conversion layer 160 formed on the epitaxial layered unit 12 opposite to the reflective layered unit 13, and first and second electrodes 151, 152 electrically connected to the reflective layered unit 13. The epitaxial layered unit 12 includes a first-type semiconductor layer 121, an active layer 122, and a second-type semiconductor layer 123. The reflective layered unit 13 is configured to reflect light (L) emitted from the epitaxial layered unit 12 towards the light conversion layer 160, and to bond the epitaxial layered unit 12 to the electrically conductive substrate 110. The reflective layered unit 13 includes a first bonding layer 131, a second bonding layer 132, and an electrically insulating layer 134 disposed between the first and second bonding layers 131, 132 and electrically isolating the first and second bonding layers 131, 132 from each other. At least one of the first bonding layer 131, the second bonding layer 132, and the electrically insulating layer 134 is made of a reflective material. For example, one of the first and second bonding layers 131, 132 is made of a metallic reflective material, and/or the electrically insulating layer 134 is made of an electrically insulating reflective material. The first bonding layer 131 is electrically connected to the first-type semiconductor layer 121 and the first electrode 151. The reflective layered unit 13 further includes at least one protrusion 133 that extends from the second bonding layer 132 towards the epitaxial layered unit 12 and terminates at the second-type semiconductor layer 123. The second bonding layer 132 is electrically connected to the second-type semiconductor layer 123 through the protrusion 133 and is electrically connected to the second electrode 152.

However, an increase of the current density requires an improved heat-dissipation property, which might adversely affect an external quantum efficiency of the LED. In addition, it can be observed from a light distribution curve (FIG. 2) of the conventional vertical LED that, the light exits from the conventional vertical LED at a light-exit angle of 114.19°, indicating the light generally exits through a single surface, i.e., an upper surface of the conventional vertical LED. Taking the conversion of blue light to white light as an example, when the blue light emitted from the active layer 122 of the epitaxial layered unit 12 is reflected by the reflective layered unit 13 and mainly returns to the upper surface of the epitaxial layered unit 12, an increased amount of phosphors is required in the light conversion layer 160 to convert the blue light into a desired white light, which might increase internal scattering of the blue light, thereby resulting in a decrease in an overall lumen density and a light extraction efficiency of the conventional vertical LED.

SUMMARY

Therefore, an object of the disclosure is to provide a light-emitting diode that can alleviate or eliminate at least one of the drawbacks of the prior art.

According to the disclosure, the light-emitting diode includes an epitaxial layered structure, a reflective layered unit, and a light-transmissive structure. The epitaxial layered structure includes a first-type semiconductor layer, a second-type semiconductor layer, and an active layer sandwiched between the first-type semiconductor layer and the second-type semiconductor layer. The epitaxial layered structure has opposite upper and lower surfaces and a side surface interconnecting the upper and lower surfaces. The reflective layered unit is disposed on the lower surface of the epitaxial layered structure. The light-transmissive structure covers the upper surface of the epitaxial layered structure and a portion of the side surface of the epitaxial layered structure, and is configured to allow an emission light emitted from the epitaxial layered structure to exit therefrom at a light-exit angle of not smaller than 125°.

BRIEF DESCRIPTION OF THE DRAWINGS

Other features and advantages of the disclosure will become apparent in the following detailed description of the embodiments with reference to the accompanying drawings, in which.

DETAILED DESCRIPTION

Figure 1:
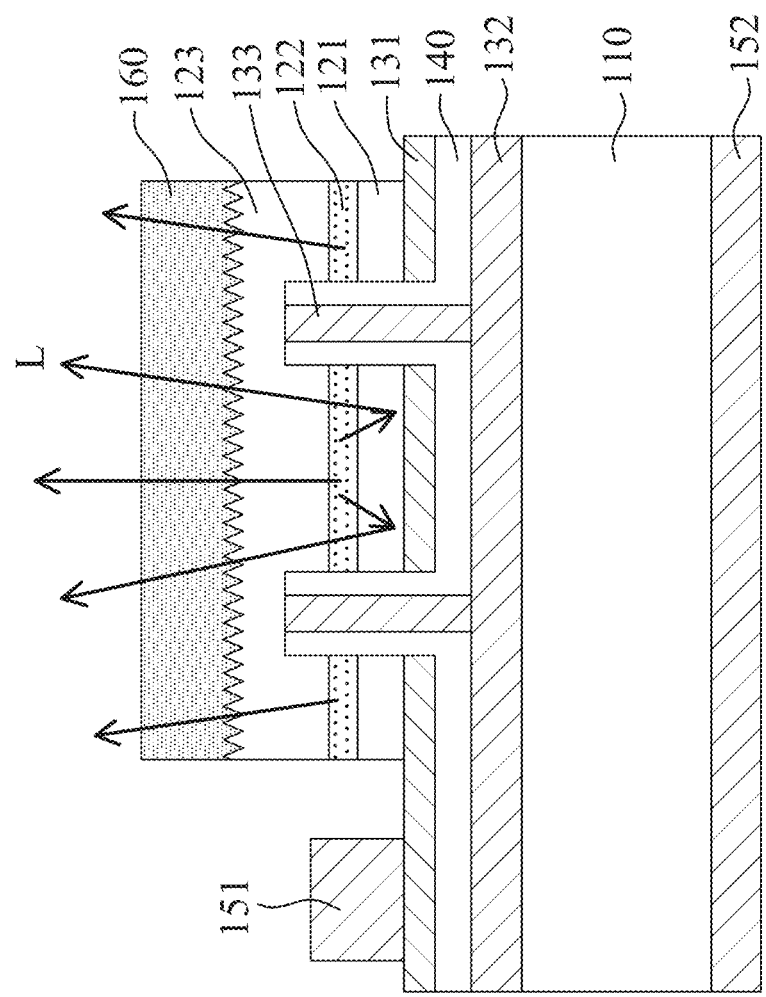
FIG. 1 is a cross-sectional schematic view of a conventional light-emitting diode (LED)

Before the disclosure is described in greater detail, it should be noted that where considered appropriate, reference numerals have been repeated among the figures to indicate corresponding or analogous elements, which may optionally have similar characteristics.

Figure 3:
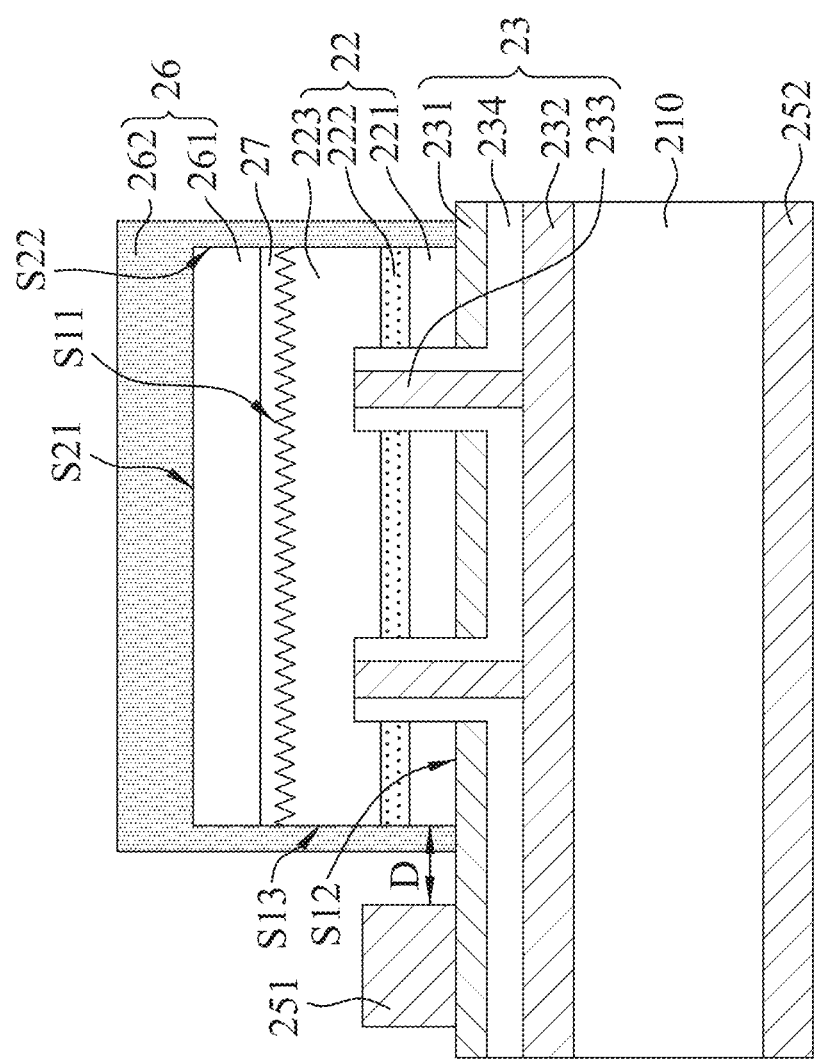
FIG. 3 is a cross-sectional schematic view of a first embodiment of an LED according to the disclosure.

Referring to FIG. 3, a first embodiment of a light-emitting diode (LED) according to the disclosure includes a substrate 210, an epitaxial layered structure 22, a reflective layered unit 23, a light-transmissive structure 26, and a first electrode 251 and a second electrode 252.

The substrate 210 may be made of an electrically conductive material. In addition, the substrate 210 may further include materials having satisfactory heat-dissipation property and thermal conductivity, such as, silicon and copper tungsten (CuW). The first and second electrodes 251, 252 are disposed on opposite sides of the substrate 210, and are electrically connected to the epitaxial layered structure 22.

The epitaxial layered structure 22 has opposite upper and lower surfaces S11, S12 and a side surface S13 interconnecting the upper and lower surfaces S11, S12. In this embodiment, the epitaxial layered structure 22 is disposed on the substrate 210 and includes a first-type semiconductor layer 221, a second-type semiconductor layer 223, and an active layer 222 sandwiched between the first-type semiconductor layer 221 and the second-type semiconductor layer 223.

The reflective layered unit 23 is disposed on the lower surface S12 of the epitaxial layered structure 22. The reflective layered unit 23 may include a first bonding layer 231, a second bonding layer 232, and an electrically insulating layer 234 that is disposed between the first and second bonding layers 231, 232 and that electrically isolates the first and second bonding layers 231, 232 from each other. The second bonding layer 232 may include at least one protrusion 233 that extends through the first-type semiconductor layer 221 and the active layer 222 and that contacts with the second-type semiconductor layer 223. The first bonding layer 231 is electrically connected to the first-type semiconductor layer 221 and the first electrode 251. The second bonding layer 232 is electrically connected to the second-type semiconductor layer 223 and the second electrode 252.

In certain embodiments, at least one of the first bonding layer 231, the second bonding layer 232, and the electrically insulating layer 234 includes a reflective material, so as to reflect light emitted from the epitaxial layered structure 22. The second bonding layer 232 may further include one of an adhesive material and a metallic bonding material in order to securely connect to the substrate 210.

In certain embodiments, the first bonding layer 231 includes a metallic reflective material (e.g., aluminum or silver) having a reflectance of not less than 90%, and the second bonding layer 232 includes a metallic bonding material. In other embodiments, both of the first bonding layer 231 and the second bonding layer 232 include metallic reflective materials, so that the lower surface S12 of the epitaxial layered structure 22 is substantially covered by the metallic reflective materials, ensuring light emitted from the epitaxial layered structure 22 is reflected thereby. In still other embodiments, the second bonding layer 232 may include a metallic reflective material, and the electrically insulating layer 234 may be an electrically insulating reflective layer, e.g., a Bragg reflector.

The light-transmissive structure 26 covers the upper surface S11 of the epitaxial layered structure 22 and a portion of the side surface S13 of the epitaxial layered structure 22, and is configured to allow an emission light emitted from the epitaxial layered structure 22 to exit therefrom at a light-exit angle of not smaller than 125°. In this embodiment, the light-exit angle is not smaller than 135°.

In certain embodiments, the light-transmissive structure 26 may have a thickness of not less than 100 μm. The light-transmissive structure 26 may include a transparent layer 261 disposed on the upper surface S11 of the epitaxial layered structure 22, which may have a thickness of not less than 30 μm, such as ranging from 50 μm to 100 μm or 100 μm to 200 μm. The light exit-angle may be increased by increasing a thickness of the transparent layer 261. For example, when the thickness of the transparent layer 261 is within a range of 50 μm to 80 μm, the light-exit angle is within a range of 135° to 150°. When the thickness of the transparent layer 261 is within a range of 100 μm to 120 μm, the light-exit angle is within a range of 150° to 160°. When the thickness of the transparent layer 261 is greater than 120 μm, the light-exit angle is greater than 160°. The transparent layer 261 may have a refractive index which is not smaller than 1 and not greater than a refractive index of the epitaxial layered structure 22, so as to reduce total internal reflection in the transparent layer 261, thereby improving a light extraction efficiency of the LED. In certain embodiments, the refractive index of the transparent layer 261 ranges from 1.45 to 1.55. The transparent layer 261 may be a light-transmissive silica gel layer, or a transparent substrate such as a sapphire substrate or a glass substrate, which may be connected to the epitaxial layered structure 22 through a bonding layer 27. That is, in certain embodiments, the bonding layer 27 may be disposed between the light-transmissive structure 26 and the epitaxial layered structure 22 to bond therebetween. For instance, the bonding layer 27 is disposed between the second-type semiconductor layer 223 of the epitaxial layered structure 22 and the transparent layer 261 of the light-transmissive structure 26.

In this embodiment, the light-transmissive structure 26 further includes a light conversion layer 262 which is disposed over the transparent layer 261, and which is configured to convert the emission light emitted from the epitaxial layered structure 22 into an excited light having a wavelength different from that of the emission light. The light conversion layer 262 may have a thickness of not greater than 120 μm. In certain embodiments, the thickness of the light conversion layer 262 may be within a range of 20 μm to 120 μm (e.g., 20 μm to 50 μm, 50 μm to 80 μm, 80 μm to 100 μm, or 100 μm to 120 μm).

In certain embodiments, the light-transmissive structure 26 includes a top transmissive part which covers the upper surface S11 of the epitaxial layered structure 22, and a side transmissive part which is connected to the top transmissive part and which covers a portion of the side surface S13 of the epitaxial layered structure 22. A thickness of the top transmissive part extending in a direction away from the upper surface S11 is greater than a thickness of the side transmissive part extending in a direction away from the side surface S13 of the epitaxial layered structure 22. In the first embodiment, the top transmissive part includes the transparent layer 261 and a portion of the light conversion layer 262 disposed above the transparent layer 261, and the side transmissive part is the remaining portion of the light conversion layer 262 that covers the side surface S13.

Figure 2:
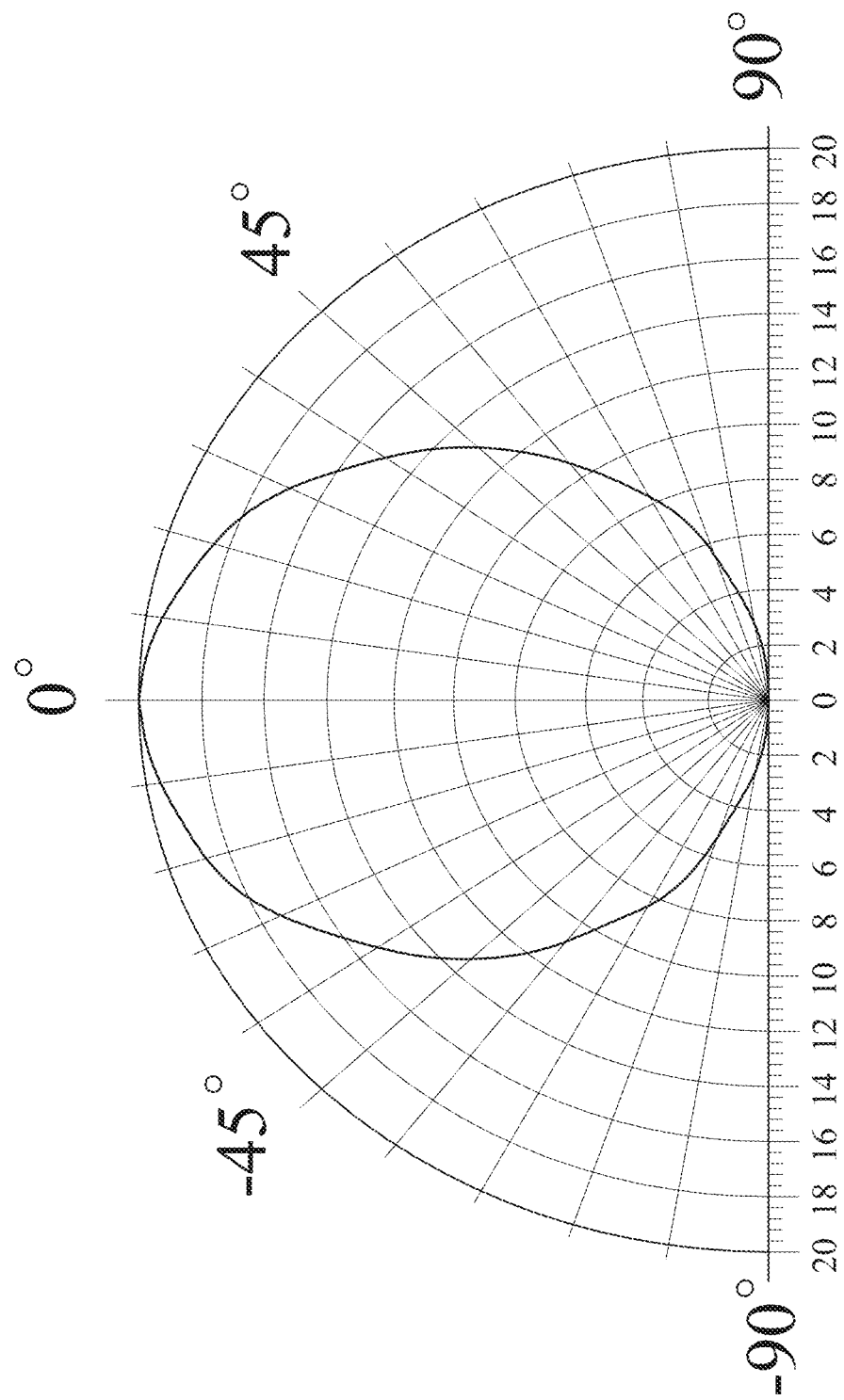
FIG. 2 is a light distribution curve of the conventional LED.
Figure 4:
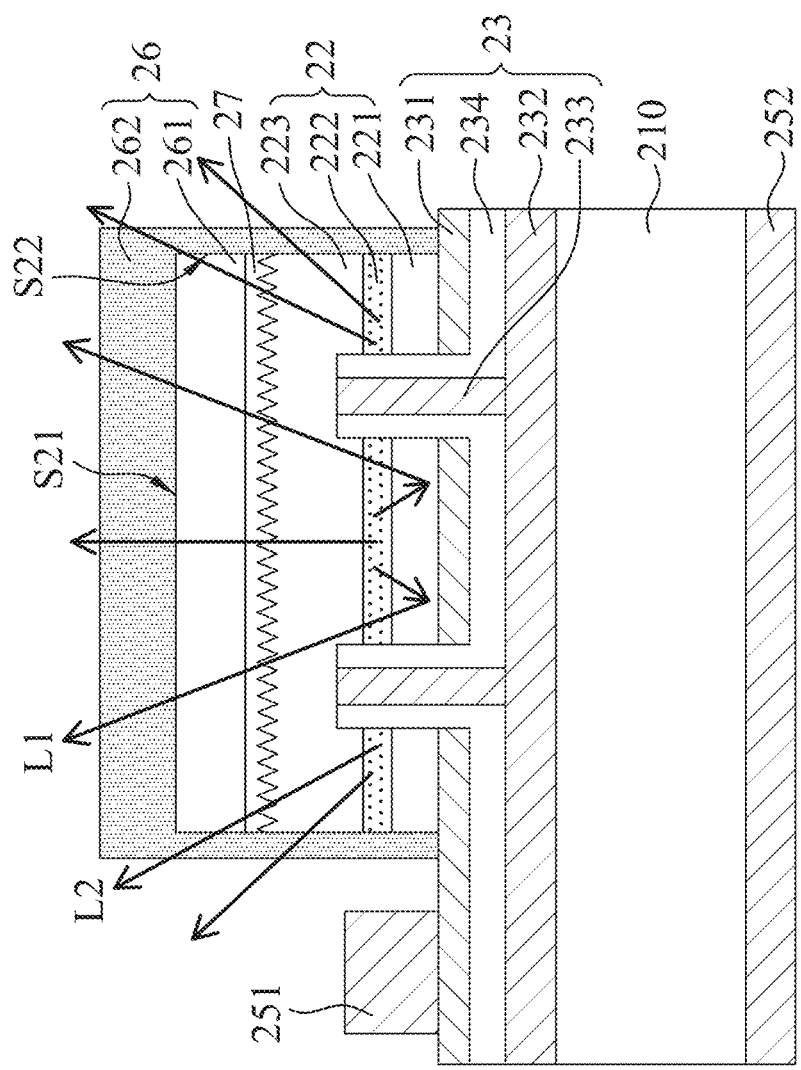
FIG. 4 is a cross-sectional schematic view illustrating light paths of an emission light emitted from an epitaxial layered structure of first embodiment of the LED.
Figure 5:
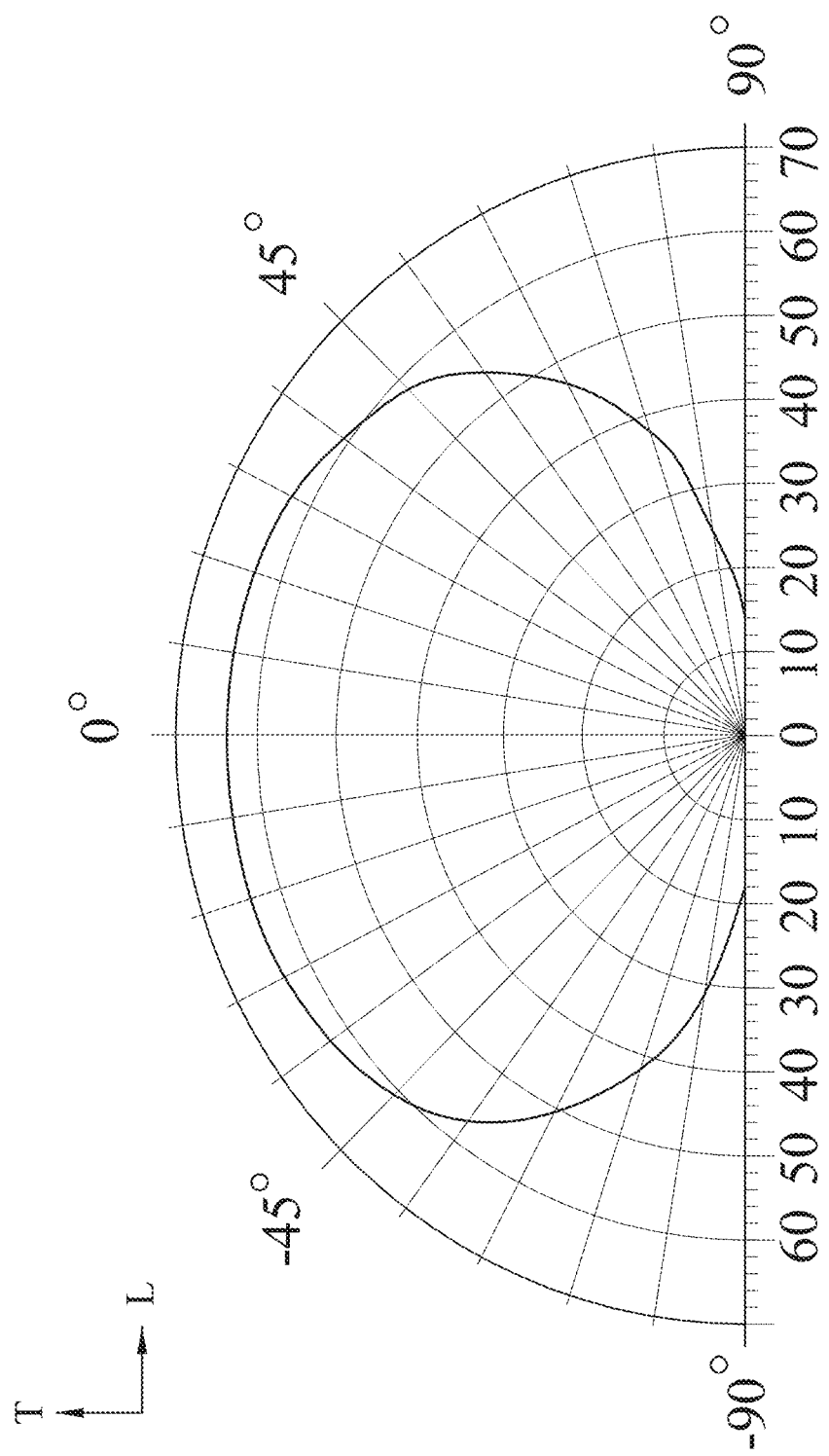
FIG. 5 is a light distribution curve of the first embodiment of the LED.

Referring to FIG. 4, in this embodiment, by forming the light-transmissive structure 26 including the transparent layer 261, a portion of the emission light (L1) emitted from the epitaxial layered structure 22 exits the transparent layer 261 from an upper surface S21 thereof, and another portion of the emission light (L2) exits the transparent layer 261 from a side surface S22 thereof, indicating that in the LED of this disclosure, the light is allowed to exit the light-transmissive structure 26 at an increased light-exit angle (such as not smaller than 135°), as compared to that in the conventional LED as shown in FIGS. 1 and 2 (i.e., approximately 110°). That is, the LED of this disclosure is capable of emitting light through multiple light exiting surfaces (rather than a single surface as shown in the conventional LED). Referring further to FIG. 5, a light distribution curve of light output from the first embodiment of the LED is in an oval shape having a maximum length in a longitudinal direction (L) and a maximum width in a transverse direction (T) that is perpendicular to the longitudinal direction (L), and the maximum length is greater than the maximum width. In certain embodiments, when the transparent layer 261 has a thickness ranging from 50 μm to 100 μm, and the light conversion layer 262 has a thickness ranging from 35 μm to 100 μm, the light-exit angle of the emission light emitted from the epitaxial layered structure 22 can be greater than 150°.

Figure 6:
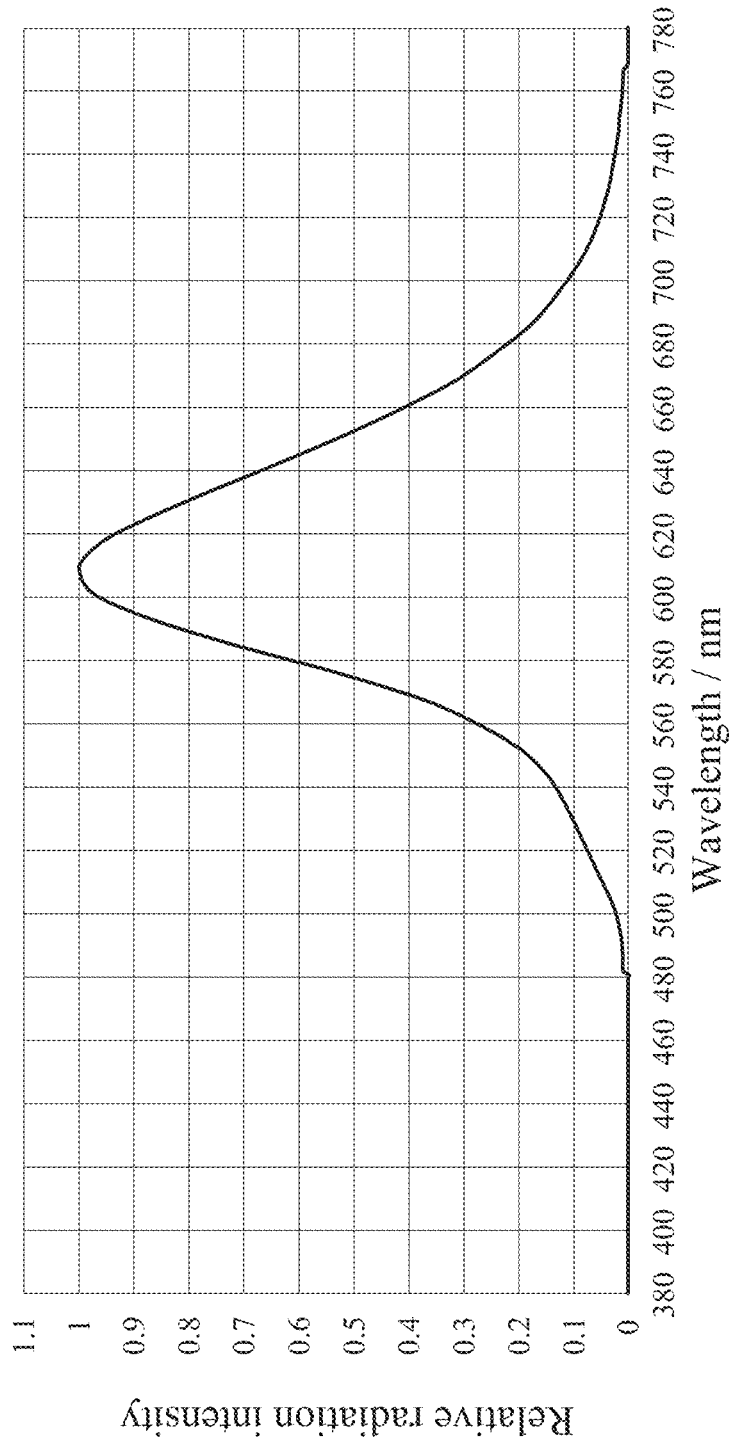
FIG. 6 is a graph illustrating a relative radiation intensity of the emission light emitted from the LED of this disclosure as a function of wavelength.

Taking the conversion of a blue light into a visible light as an example, when the light conversion layer 262 has a thickness of not less than 100 μm, the blue light emitted from the epitaxial layered structure 22 can be converted into a monochromatic compensation light or an amber light having an emission peak wavelength of approximately 608 nm. As shown in FIG. 6, when the thickness of the light conversion layer 262 is 100 μm, the light output from the LED has a peak wavelength of 608 nm, and the relative radiation intensity at a blue light wavelength range (i.e., 380 nm to 500 nm) is close to 0.

In this embodiment, since the light-transmissive structure 26 covers not only the upper surface S11 of the epitaxial layered structure 22 but also the side surface S13 of the epitaxial layered structure 22, the light emitted from the active layer 222 is allowed to exit the transparent layer 261 at a larger light-exit angle (i.e., in a more distributed manner) through multiple (e.g., five) light exiting surfaces, and the light conversion layer 262 may contain a light conversion material in a reduced density due to an increased coverage area on the transparent layer 261, which in turn reduces internal scattering of the light in the light conversion layer 262, thereby improving a light extraction efficiency of the LED.

In certain embodiments, the epitaxial layered structure 22 and the first electrode 251 are spaced apart by a distance (D) that is not less than 50 μm, (such as 100 μm), in order for a fluorescent film serving as the light conversion layer 262 to be formed on the side surface S13 of the epitaxial layered structure 22 adjacent to the first electrode 251.

Figure 7:
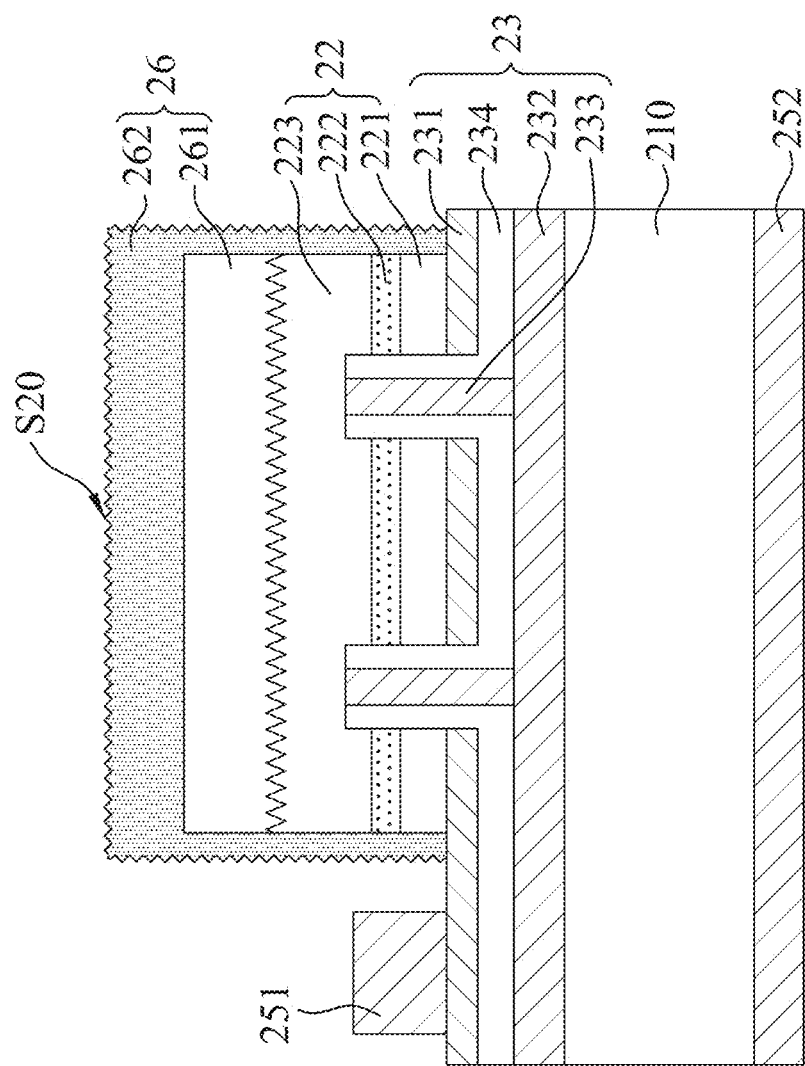
FIG. 7 is a cross-sectional schematic view of a second embodiment of the LED according to the disclosure.

Referring to FIG. 7, a second embodiment of the LED according to the disclosure is similar to the first embodiment except that the light conversion layer 262 of the second embodiment of the LED has a patterned surface opposite to the epitaxial layered structure 22, so as to increase a light exit area.

Figure 8:
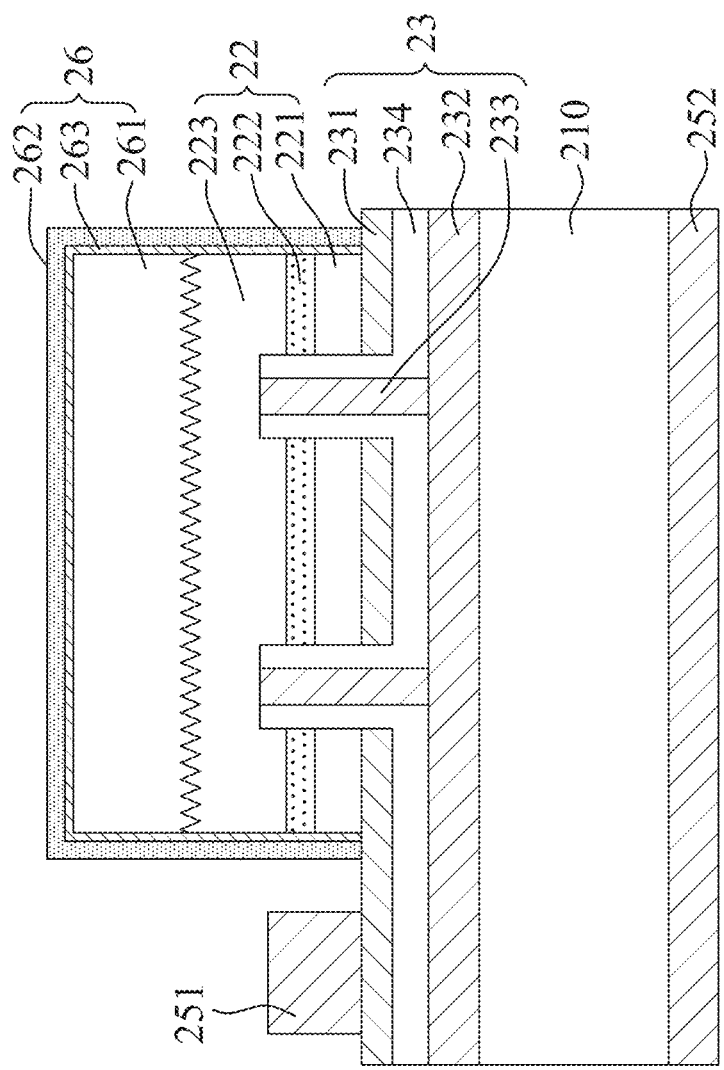
FIG. 8 is a cross-sectional schematic view of a third embodiment of the LED according to the disclosure.

Referring to FIG. 8, a third embodiment of the LED according to the disclosure is similar to the first embodiment except that the light-transmissive structure 26 of the third embodiment further includes an optical layer 263 which is disposed between the light conversion layer 262 and the transparent layer 261, and which is configured to allow the emission light to transmit therethrough and to reflect the excited light emitted from the light conversion layer 262. To be specific, the optical layer 263 may include a first dielectric sublayer made of silicon dioxide ($SiO_2$) and a second dielectric sublayer made of titanium dioxide ($TiO_2$) that are sequentially disposed on the transparent layer 261. By controlling the thickness of each of the first and second dielectric sublayers, the optical layer 263 may allow blue light to transmit therethrough so as to reach the light conversion layer 262, and to reflect light having a wavelength of not less than 500 nm (i.e., those converted by the light conversion layer 262).

Figure 9:
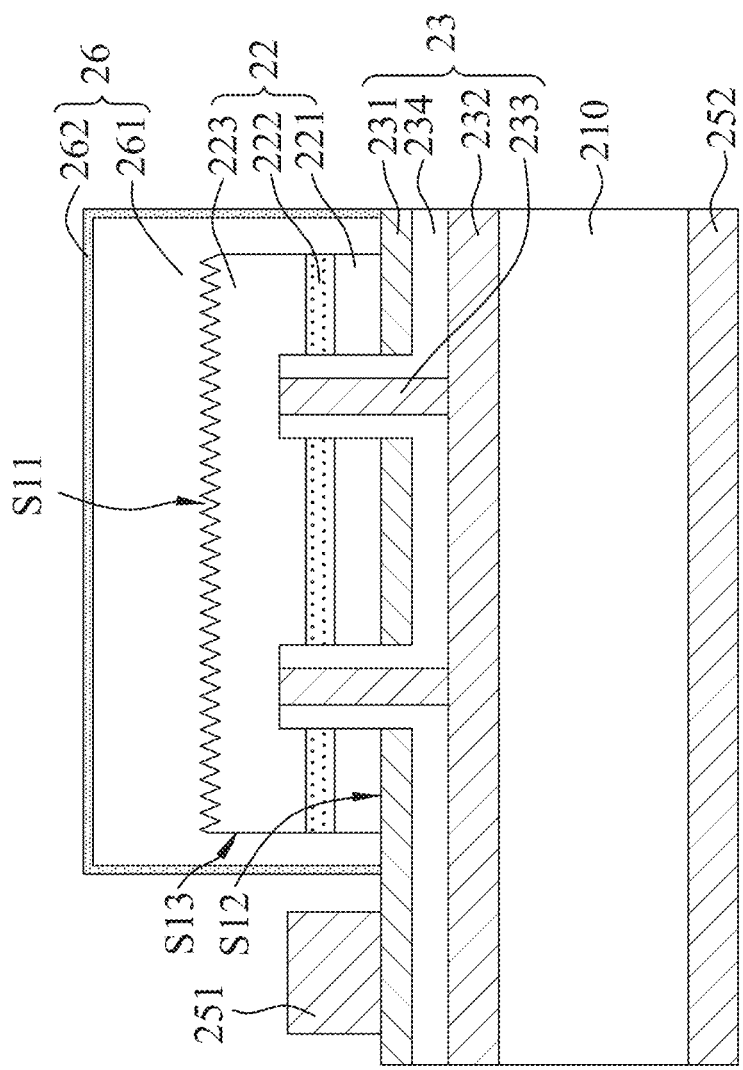
FIG. 9 is a cross-sectional schematic view of a fourth embodiment of the LED according to the disclosure.

Referring to FIG. 9, a fourth embodiment of the LED according to the disclosure is similar to the first embodiment except that the transparent layer 261 of the third embodiment not only covers the upper surface S11 of the epitaxial layered structure 22, but also covers a portion of the side surface S13 of the epitaxial layered structure 22, and the light conversion layer 262 is formed on the upper surface S21 and the side surface S22 of the transparent layer 261 by, e.g., spraying phosphor powders.

Figure 10:
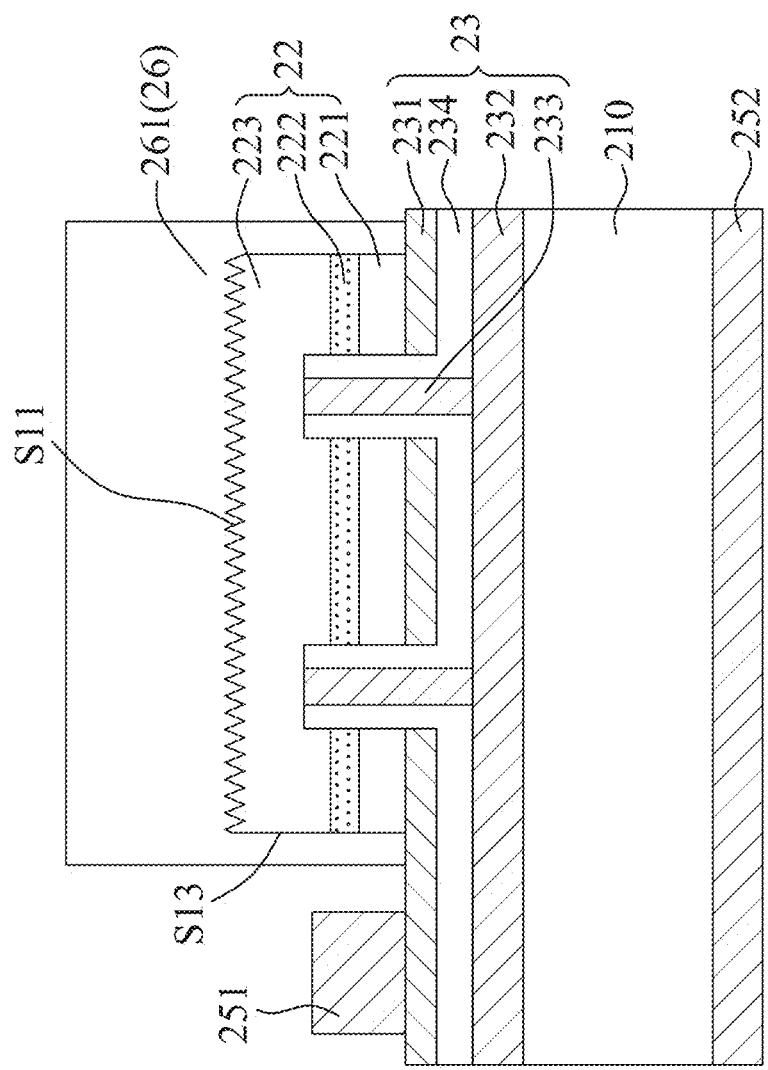
FIG. 10 is a cross-sectional schematic view of a fifth embodiment of the LED according to the disclosure.

Referring to FIG. 10, a fifth embodiment of the LED according to the disclosure is similar to the fourth embodiment except that the light-transmissive structure 26 of the fifth embodiment does not include the light conversion layer 262. That is to say, the light-transmissive structure 26 of the fifth embodiment only includes the transparent layer 261, which covers the upper surface S11 (i.e., the top transmissive part) and the side surface S13 (i.e., the side transmissive part) of the epitaxial layered structure 22. By adjusting the thickness of the top transmissive part, the light-exit angle of the emission light may be controlled to be not smaller than 125°. For example, when the thickness of the top transmissive part is 34 μm, the light-exit angle could reach 127°. When the thickness of the top transmissive part is 105 μm, the light-exit angle could reach 155°. When the thickness of the top transmissive part is 120 μm, the light-exit angle could reach 158°.

In sum, by forming the light-transmissive structure 26 over the epitaxial layered structure 22, the emission light emitted from the epitaxial layered structure 22 may exit from the LED of this disclosure at a larger light-exit angle (such as not smaller than 125°), i.e., the light exiting surfaces are increased. Therefore, when the light conversion layer 262 to be included in the LED of this disclosure converts the emission light into a desired excited light, the excitation surface of the light conversion layer 262 may be increased due to the larger light-exit angle, and the internal scattering of the light in the light conversion layer 261 can be significantly reduced, so as to increase a light extraction efficiency of the LED.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting diode, comprising:
   a substrate;
   an epitaxial layered structure which is disposed on said substrate and which includes a first-type semiconductor layer, a second-type semiconductor layer, and an active layer sandwiched between said first-type semiconductor layer and said second-type semiconductor layer, said epitaxial layered structure having opposite upper and lower surfaces and a side surface interconnecting said upper and lower surfaces;
   a reflective layered unit which is disposed on said lower surface of said epitaxial layered structure;
   a light-transmissive structure which covers said upper surface of said epitaxial layered structure and a portion of said side surface of said epitaxial layered structure, and which is configured to allow an emission light emitted from said epitaxial layered structure to exit therefrom at a light-exit angle of not smaller than 125°; and
   a first electrode and a second electrode which are electrically connected to said epitaxial layered structure and which are disposed on opposite sides of said substrate,
   wherein a light distribution curve of light output from said light-emitting diode is in an oval shape having a maximum length in a longitudinal direction and a maximum width in a transverse direction that is perpendicular to the longitudinal direction, the maximum length being greater than the maximum width,
   wherein said light-transmissive structure comprises:
   a transparent layer disposed on said upper surface of said epitaxial layered structure, said transparent layer being a sapphire substrate and having a thickness of not less than 30 µm; and
   a light conversion layer disposed over said transparent layer, and configured to convert the emission light emitted from said epitaxial layered structure into an excited light having a wavelength different from that of the emission light,
   wherein said epitaxial layered structure and said first electrode are spaced apart by a distance so that said light conversion layer is formed on said side surface of said epitaxial layered structure adjacent to said first electrode, and
   wherein said first electrode is exposed from said light conversion layer.

2. The light-emitting diode according to claim 1, wherein the light-exit angle is not smaller than 135°.

3. The light-emitting diode according to claim 1, wherein the light-exit angle is not smaller than 150°.

4. The light-emitting diode according to claim 1, wherein said light-transmissive structure includes a top transmissive part which covers said upper surface of said epitaxial layered structure, and a side transmissive part which is connected to said top transmissive part and which covers a portion of said side surface of said epitaxial layered structure, a thickness of said top transmissive part extending in a direction away from said upper surface is greater than a thickness of said side transmissive part of said light-transmissive structure extending in a direction away from said side surface.

5. The light-emitting diode according to claim 1, wherein said transparent layer has a refractive index which is not smaller than 1 and not greater than a refractive index of said epitaxial layered structure.

6. The light-emitting diode according to claim 1, wherein said light conversion layer has a thickness ranging from 20 µm to 120 µm.

7. The light-emitting diode according to claim 1, wherein said light conversion layer has a patterned surface opposite to said epitaxial layered structure.

8. The light-emitting diode according to claim 1, wherein said light-transmissive structure has a thickness of not less than 100 µm.

9. The light-emitting diode according to claim 1, wherein said light-transmissive structure further includes an optical layer which is sandwiched between said light conversion layer and said transparent layer, and which is configured to allow the emission light to transmit therethrough and to reflect the excited light emitted from said light conversion layer.

10. The light-emitting diode according to claim 9, wherein said optical layer includes a first dielectric sublayer made of $SiO_2$ and a second dielectric sublayer made of $TiO_2$ that are sequentially disposed on said transparent layer.

11. The light-emitting diode according to claim 1, further comprising a bonding layer that is disposed between said light-transmissive structure and said epitaxial layered structure to bond therebetween.

12. The light-emitting diode according to claim 1, wherein said epitaxial layered structure and said first electrode are spaced apart by said distance that is not less than 50 µm.

13. The light-emitting diode according to claim 1, wherein said upper surface of said epitaxial layered structure is a roughened surface, and said transparent layer is directly disposed on said upper surface.

* * * * *